(12) United States Patent
Chaparro Monferrer et al.

(10) Patent No.: US 8,209,989 B2
(45) Date of Patent: Jul. 3, 2012

(54) MICROARCHITECTURE CONTROL FOR THERMOELECTRIC COOLING

(75) Inventors: Pedro Chaparro Monferrer, Barcelona (ES); Jose Gonzalez, Terrassa (ES); Gregory Martin Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1054 days.

(21) Appl. No.: 11/694,788

(22) Filed: Mar. 30, 2007

(65) Prior Publication Data
US 2008/0236175 A1 Oct. 2, 2008

(51) Int. Cl.
*F25B 21/02* (2006.01)

(52) U.S. Cl. ............................................. 62/3.7; 62/3.2

(58) Field of Classification Search ............ 62/3.2, 62/3.1, 3.7, 259.2
See application file for complete search history.

(56) References Cited

U.S. PATENT DOCUMENTS

| | | | | |
|---|---|---|---|---|
| 2,984,077 | A * | 5/1961 | Gaskill | 62/3.2 |
| 4,718,021 | A * | 1/1988 | Timblin | 700/277 |
| 5,076,346 | A * | 12/1991 | Otsuka | 165/217 |
| 5,569,950 | A * | 10/1996 | Lewis et al. | 257/467 |
| 5,650,904 | A * | 7/1997 | Gilley et al. | 361/56 |
| 5,802,856 | A * | 9/1998 | Schaper et al. | 62/3.7 |
| 5,867,990 | A * | 2/1999 | Ghoshal | 62/3.7 |
| 6,701,272 | B2 * | 3/2004 | Cooper et al. | 702/132 |
| 6,704,877 | B2 * | 3/2004 | Cline et al. | 713/320 |
| 7,765,825 | B2 | 8/2010 | Wyatt | |
| 7,866,173 | B2 * | 1/2011 | Brunschwiler et al. | 62/185 |
| 7,980,084 | B2 * | 7/2011 | Okamoto et al. | 62/3.7 |
| 2001/0003901 | A1 * | 6/2001 | Bolandi et al. | 62/3.7 |
| 2001/0008071 | A1 * | 7/2001 | Macias et al. | 62/3.7 |
| 2002/0062648 | A1 * | 5/2002 | Ghoshal | 62/3.7 |
| 2002/0063330 | A1 * | 5/2002 | Macris | 257/712 |
| 2003/0167389 | A1 * | 9/2003 | Soltis et al. | 712/220 |
| 2003/0229662 | A1 * | 12/2003 | Luick | 709/106 |
| 2005/0091989 | A1 * | 5/2005 | Leija et al. | 62/3.2 |
| 2006/0086103 | A1 * | 4/2006 | Lee et al. | 62/126 |
| 2007/0144726 | A1 * | 6/2007 | Scherer et al. | 165/203 |
| 2007/0163269 | A1 * | 7/2007 | Chung et al. | 62/3.2 |
| 2008/0028767 | A1 * | 2/2008 | Broderick | 62/3.2 |
| 2008/0163230 | A1 * | 7/2008 | Latorre et al. | 718/104 |

OTHER PUBLICATIONS

Caswell, W., "Dell H2C Technology: Hybrid Cooling for Overclocked CPUs", White Paper, Jan. 2007, pp. 1-5.
Donald, J. and M. Martonosi, "Techniques for Multicore Thermal Management: Classification and New Exploration", Proceedings of the 33rd International Symposium on Computer Architecture, 2006, 11 pp.
Intel Corporation, "Processors-Package Type Guide (Desktop Processors)", [online], Jul. 6, 2006, [retrieved on Mar. 14, 2007], retrieved from the Internet at <URL: http://www.intel.com/support/processors/sb/CS-009863.htm>, 3 pp.
Prasher, R.S., J. Chang, I. Sauciuc, S. Narasimhan, D. Chau, G. Chrysler, A. Myers, S. Prstic, and C. Hu, "Nano and Micro Technology-Based Next-Generation Package-Level Cooling Solutions", Intel Technology Journal, vol. 9, Issue 4, 2005, 14 pp.
Wikipedia, "Computer Cooling", [online], Mar. 16, 2007, [retrieved on Mar. 18, 2007], retrieved from the Internet at <URL: http://en.wikipedia.org/wiki/computer_cooling>.

* cited by examiner

*Primary Examiner* — J. J. Swann
*Assistant Examiner* — Alexis Cox
(74) *Attorney, Agent, or Firm* — Konrad Raynes & Victor LLP

(57) ABSTRACT

An integrated circuit is cooled by microarchitecture controlled Peltier effect cooling. In one embodiment, a temperature sensor thermally coupled to at least a portion of the integrated circuit of a die is adapted to provide an output as a function of the temperature of an integrated circuit portion. Operation of a thermoelectric cooler thermally coupled to the integrated circuit portion is controlled as a function of the sensor output, wherein a controller of the integrated circuit controls the thermal electric cooler. Other embodiments are described and claimed.

20 Claims, 4 Drawing Sheets

MICROARCHITECTURE CONTROL FOR THERMOELECTRIC COOLING

BACKGROUND

Many integrated circuits including central processing units (CPUs) may be damaged if operated at too high a temperature. For example, an integrated circuit if overheated can reduce the life-span of the circuit and may interfere with proper operation. A variety of techniques have been proposed or utilized to dissipate the heat generated by such computer components. For example, heat sinks have been used to increase the surface area which dissipates the heat. A heat sink is frequently a block of metal machined to have a number of fins and ridges to increase its surface area. An adhesive or clamp may be used to affix the heat sink to the package containing the integrated circuit.

Often, a thermally conductive pad, gel or paste is placed between the integrated package and the heat sink to facilitate the flow of heat from the integrated circuit to the heat sink to be dissipated. Such heat flow may be further facilitated by another heat sink internal to the package. Such internal heat sinks, often referred to as integrated heat spreaders, are disposed on the die with a layer of thermally conductive material between the heat spreader and the die. A second layer of thermally conductive material may be disposed between the internal heat sink of the package and an external heat sink. Many such external heat sinks have an attached fan to further increase heat dissipation. Integrated circuits utilizing an individual heat sink for that particular integrated circuit include CPU's, Graphic Processor Units (GPUs) and Northbridge integrated circuits.

Another technique is often referred to as "softcooling" in which the operation of an integrated circuit may be throttled down to decrease heat generation. In some integrated circuit designs, one or more thermal sensors are included on the integrated circuit die itself together with internal logic on the die which shuts down the integrated circuit if a certain temperature is exceeded or if the circuit is idle. Other softcooling techniques include internal logic circuitry which reduces the clock speed or the voltage level supplied to the integrated circuit to slow down operation and thereby reduce heat generation if it is overheating or has a relatively low workload. Another soft cooling technique shifts a thread of operation from an integrated circuit portion such as a core which is overheating to another cooler core of a multicore integrated circuit.

A heat pipe which typically includes a hollow tube containing a heat transfer liquid, may also be used to cool a computer component. For example, a CPU may have a hollow heat sink coupled by a heat pipe to a larger radiator heat sink. The liquid transfers heat from the CPU through the heat pipe to the heat sink radiator.

It has also been proposed to utilize the "Peltier effect" to cool a computer component. Jean Peltier discovered that applying a voltage to a thermocouple creates a temperature differential between two sides, providing a heat pump, often referred to as a Thermoelectric Cooler (TEC). Many thermoelectric coolers may be stacked together or laid out next to each other to provide a significant amount of heat transfer. Bismuth and telluride are commonly used for thermoelectric coolers.

One or more TECs may also be thermally coupled to an integrated circuit die to provide on-die cooling. Thin Film TEC devices (TFTEC) are a particular implementation of TEC devices that can be included under the integrated heat spreader (IHS), and positioned in the thermal interface material (TIM) that "glues" the die with the IHS. The heat removed by the Peltier effect is typically a function of the intensity of the current supplied to the TEC. However, the current generates its own heat and therefore in some devices, a practical limit may exist as to the amount of current which can be effectively applied to cool a device.

DETAILED DESCRIPTION OF THE DRAWINGS

Figure 1:
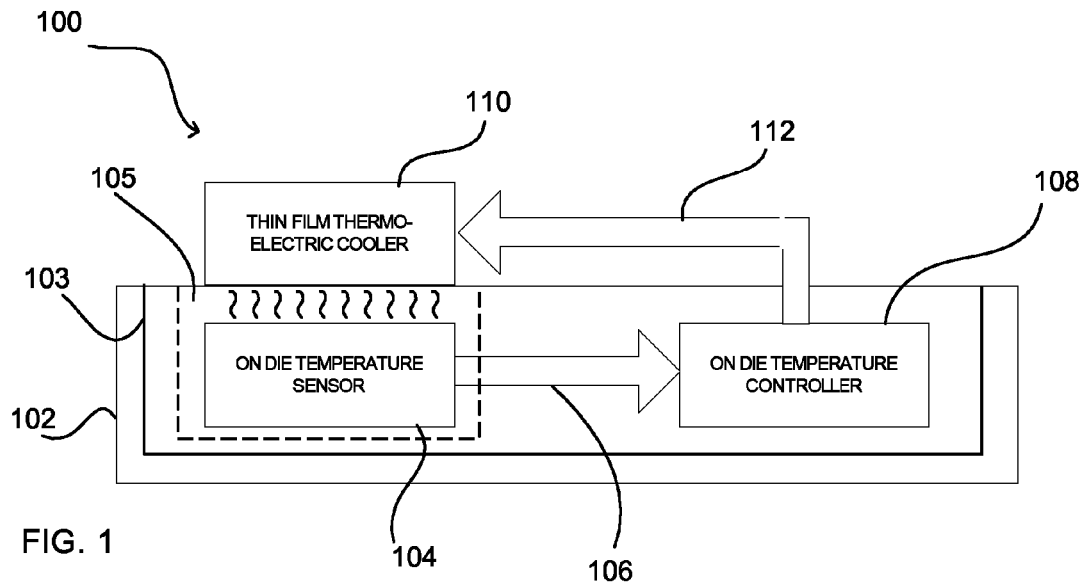
FIG. 1 is a schematic diagram of a device in accordance with one embodiment of the present description.

FIG. 1 shows one embodiment of a device 100 having microarchitecture controlled Peltier effect cooling in accordance with the present description. The device 100 includes a die 102 having one or more integrated circuits 103 fabricated thereon. A temperature sensor 104 disposed on the die 102 is thermally coupled to at least a portion 105 of the integrated circuit 103 of the die 102. The sensor 104 provides an output 106 to a controller 108 fabricated on the die 102. The output 106 of the sensor 104 is a function of the temperature of the surrounding integrated circuit portion 105 of the die 102.

The device 100 further includes a thermoelectric cooler (TEC) 110 such as a thin film thermoelectric cooler disposed on the die 102. The TEC 110 is thermally coupled to the integrated circuit portion 105 and is adapted to cool at least the portion 105 of the integrated circuit 103 when operated. The controller 108 is responsive to the sensor output 106 and is adapted to control via a suitable output 112, operation of the TEC 110, as a function of the sensor output 106. As discussed in greater detail below, such an arrangement can significantly facilitate efficient temperature management of the device 100.

Figure 2:
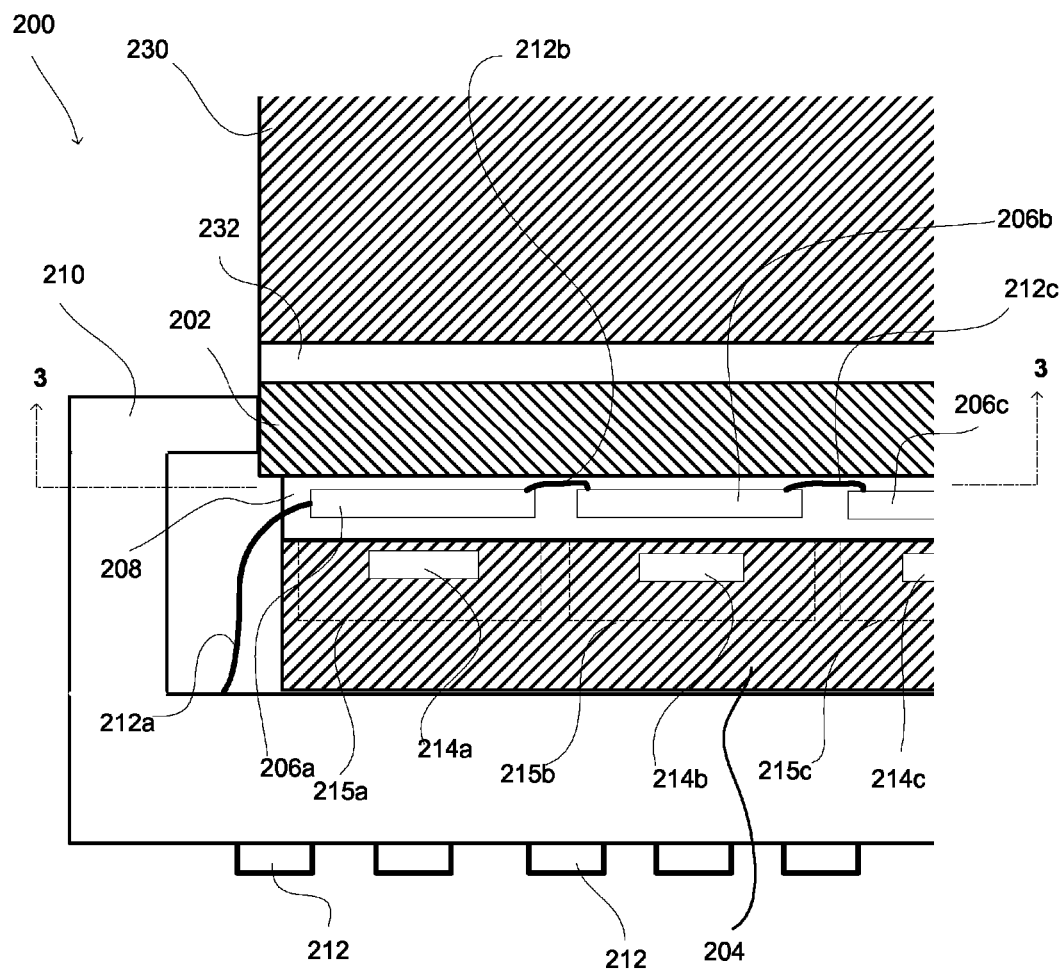
FIG. 2 is a schematic cross-sectional view of a device in accordance with another embodiment of the present description.

FIG. 2 shows another example of a device 200 employing microarchitecture controlled Peltier effect cooling in accordance with the present description. In this embodiment, the device 200 includes a first heat sink such as an integrated heat spreader 202 thermally coupled to a die 204 by a thermal interface material 208 disposed between the integrated heat spreader 202 and the die 204. A plurality of thermoelectric coolers (TECs) 206*a*, 206*b*, 206*c* . . . are disposed within the thermal interface material 208 between the die 204 and the integrated heat sink 202. The die 204, TECs 206*a*, 206*b*, 206*c* . . . , thermal interface material 208 and the integrated heat sink 202 are packaged in a package 210 having a plurality of external contacts 212 such as an array of lands, pins, balls etc.

The device 200 of this embodiment comprises a plurality of temperature sensors 214*a*, 214*b*, 214*c* . . . , each temperature sensor of the sensors 214*a*, 214*b*, 214*c* . . . being disposed on the die 204 and thermally coupled to an associated portion 215*a*, 215*b*, 215*c* . . . of an integrated circuit fabricated on the die 204. Each sensor of the sensors 214*a*, 214*b*, 214*c* . . .

provides an output to one or more controllers fabricated on the die 204. The output of each sensor of the sensors 214a, 214b, 214c . . . is a function of the temperature of the surrounding integrated circuit portion 215a, 215b, 215c . . . of the die 204. The temperature controller or controllers of the die 204 are responsive to the outputs of the sensors 214a, 214b, 214c . . . and are adapted to control via suitable conduits 212a, 212b, 212c . . . operation of the TECs 206a, 206b, 206c . . . , as a function of the output or outputs of one or more sensors 214a, 214b, 214c . . . .

The thermal interface material 208 facilitates the transfer of heat from the die 204 to the integrated heat spreader 202 which spreads the heat generated by hot spots over a wider area to facilitate dispersal of the heat. In one embodiment, a controller may control an individual TEC independently of the TECs 206a, 206b, 206c . . . . In another embodiment, a controller may control two or more TECs of the TECs 206a, 206b, 206c . . . together at a time. For example, a controller may control a TEC disposed on a particular hot spot and may also be adapted to control TECs disposed over areas of the die 204 adjacent to the particular hot spot. Accordingly, a controller may in response to a sensor associated with a hot spot indicating an excessive temperature, turn on the TEC associated with that hot spot. In addition, the controller may turn on the TECs adjacent to the hot spot to cool those areas adjacent to the hot spot notwithstanding that the sensors associated with the adjacent areas are not indicating excessive temperatures. Such an arrangement may facilitate cooling of the device 200 in embodiments having an integrated heat spreader and may also facilitate cooling of the device 200 in embodiments lacking an integrated heat spreader.

In another aspect of the present description, the device 200 may have a second heat sink 230 external to the package 210. Such an external heat sink 230 may be a block of metal machined to have a number of fins and ridges to increase its surface area. In this embodiment, a thermally conductive pad, gel or paste 232 is placed between the exposed integrated heat spreader 202 and the external heat sink 230 to facilitate the flow of heat from the integrated heat spreader 202 to the external heat sink 230 to be dissipated. An adhesive or clamp may be used to affix the external heat 230 sink to the integrated heat spreader 202 of the package 210 containing the integrated circuit on the die 204. The external heat sink 230 may have an attached fan or liquid carrying pipes to further increase heat dissipation.

Figure 3:
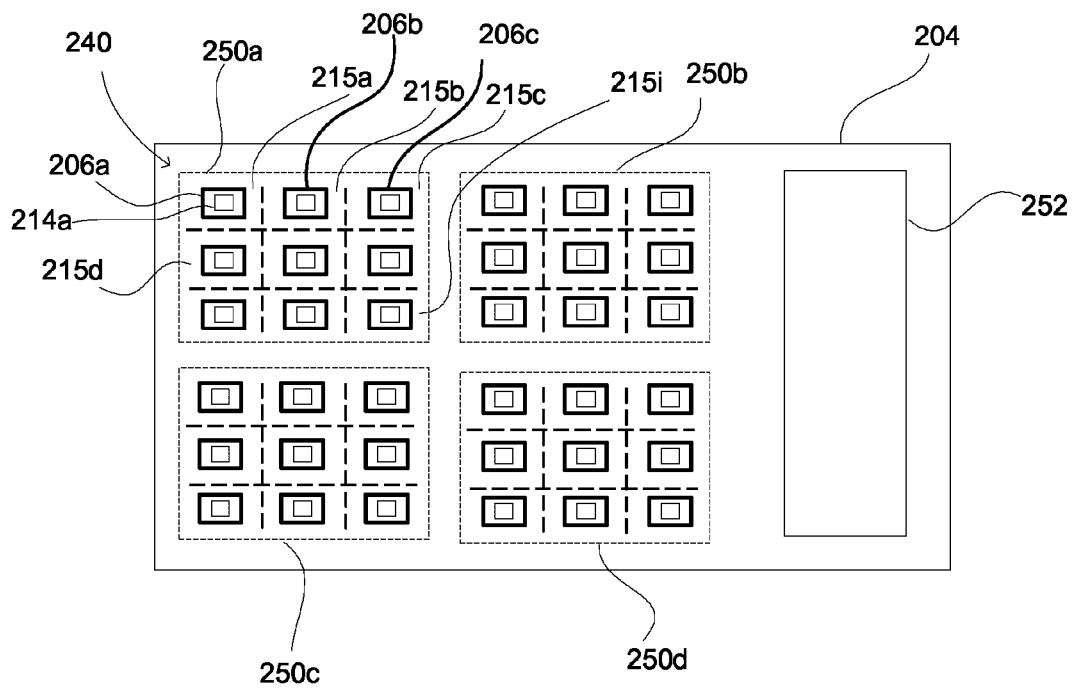
FIG. 3 is a schematic partial cross-sectional view of the device of FIG. 2.

FIG. 3 shows one example of a grid distribution of TECs 206a, 206b, 206c . . . over a die 204. In this example, an integrated circuit 240 of the die 204 includes a plurality of computer processing unit (CPU) cores 250a, 250b, 250c, . . . arranged in an orthogonal array with a shared cache 252. Although FIG. 3 depicts a 2 by 2 array of cores 250a, 250b, 250c, . . . , it should be appreciated that the integrated circuit 240 may have 0, 1, 2, 4, 8, 16 or other numbers of cores, and may have more or fewer caches, depending upon the particular application.

Each core of the cores 250a, 250b, 250c, . . . is subdivided into an array of integrated circuit portions or regions 215a, 215b, 215c . . . . Although FIG. 3 depicts a 3 by 3 array of regions 215a, 215b, 215c, . . . , it should be appreciated that the integrated circuit 240 may be subdivided into fewer or greater numbers of regions, arranged in a regular array or an irregular arrangement, depending upon the particular application.

Each region of the regions 215a, 215b, 215c, . . . may be provided one or more of a plurality of TECs 206a, 206b, 206c . . . and one or more temperature sensors of the sensors 214a, 214b, 214c . . . such that the TECs 206a, 206b, 206c . . . and the sensors 214a, 214b, 214c . . . are likewise disposed in an orthogonal array over the die 204. In this example, each TEC of the TECs 206a, 206b, 206c . . . and each sensor of the sensors 214a, 214b, 214c . . . are centered in the associated region of the regions 215a, 215b, 215c . . . . It is appreciated however that the temperature sensors 214a, 214b, 214c . . . and the TECs 206a, 206b, 206c . . . may be disposed on the die 204 in an irregular arrangement, depending upon the particular application. For example, the temperature sensors 214a, 214b, 214c . . . and the TECs 206a, 206b, 206c . . . may be positioned primarily at regions likely to become hot spots and such hot spots may not be regularly distributed over the die 204. Also, in this example, no TECs are provided over the cache 252. It is appreciated that in other applications, a cache or other non-core integrated circuit may utilize TECs as described herein.

In some applications, it may be appropriate to increase or decrease the number of TECs being utilized for cooling. For example, each core of a multicore integrated circuit may have as few as a single TEC per core in which the TEC is located over the area most likely to generate a hot spot such as a floating point unit. Thus, the sensors and TECs may be placed in a regular or irregular arrangement on the die.

Also, it is appreciated that a single die may have an assortment of TECs which vary in size, depending upon the temperature characteristics of the various circuit portions. Thus, for example, die portions which tend to operate at a higher temperature may have an associated TEC which is larger in size or cooling capacity than TECs associated with cooler operating die portions. Still further, the physical properties of the TECs employed on a particular die may vary from TEC to TEC.

Figure 4:
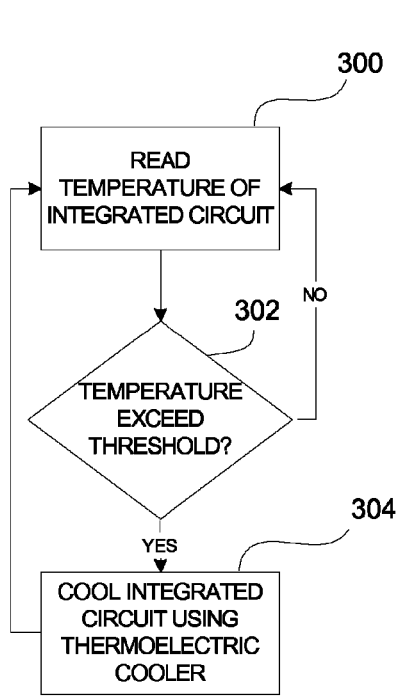
FIG. 4 is an example of operations of a device in accordance with the present description.

FIG. 4 shows one example of operations of a device such as the device 100 or 200 having microarchitecture controlled Peltier effect cooling in accordance with the present description. In one operation, a temperature sensor thermally coupled to at least a portion of an integrated circuit of a die is read (block 300). The sensor, such as a sensor 104, for example, may be adapted to provide an output as a function of the temperature of an integrated circuit portion.

Operation of a thermoelectric cooler thermally coupled to the integrated circuit portion may be controlled as a function of the sensor output. For example, a sensor output may be compared (block 302) to a predetermined threshold. The thermoelectric cooler may be activated with for example, a fixed, predefined current, if the predetermined threshold is exceeded, to cool (block 304) at least the associated portion of the integrated circuit. Conversely, the thermoelectric cooler may be deactivated (or remain inactive) if the predetermined threshold is not exceeded. In one example, a "reconfiguration interval" may be set in which, at regular or other intervals, the temperature of each cell, region or portion in the die is checked and, if it exceeds a particular threshold, the TEC is activated by supplying it with an appropriate current.

A TEC may be operated with other than fixed currents. For example, a control-theoretic mechanism may be utilized to adjust dynamically the intensity of the current supplied to each TEC. there are a variety of algorithms that are suitable for such control, including the ones used by proportional-integral-derivative (PID) controllers, which are known feedback loop components. Other types of controllers may be suitable as well including fuzzy logic controllers.

It is appreciated that the TECs may be controlled using a variety of algorithms, depending upon the particular application. For example, operating conditions of the integrated circuit may be determined and the appropriate thermoelectric cooler activated when predetermined operating conditions are met. Such predetermined operating conditions may include but not be limited to comparing the values reported by the thermal sensors to a threshold that may be predefined or may change dynamically utilizing a particular algorithm.

Figure 5:
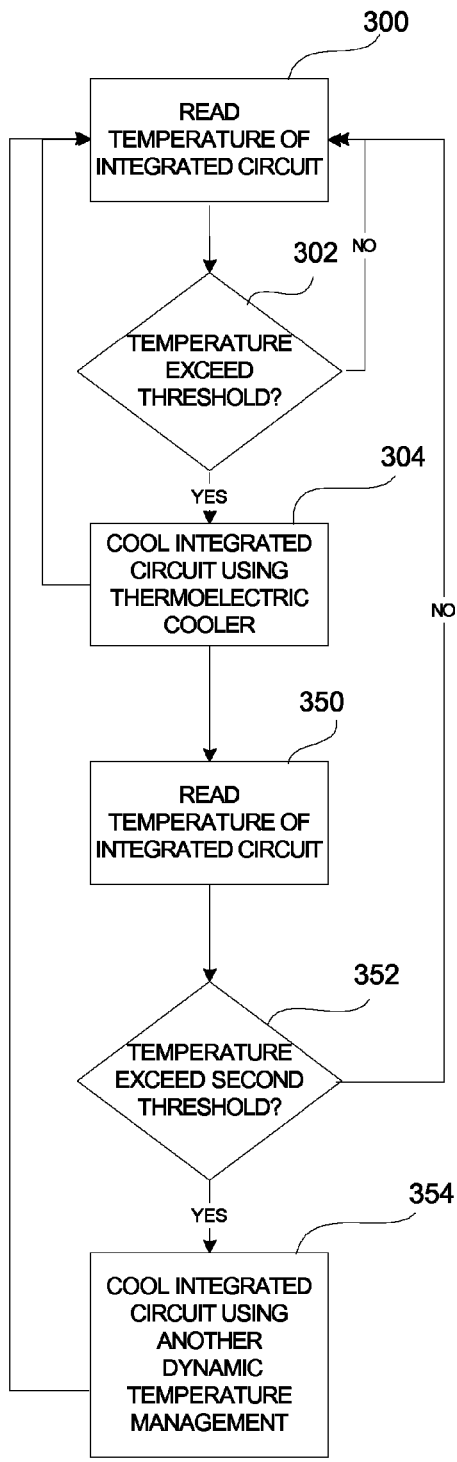
FIG. 5 is another example of operations of a device in accordance with the present description.

FIG. 5 shows another example of operations of a device such as the device 100 or 200 having microarchitecture controlled Peltier effect cooling in accordance with the present description. In this embodiment, a control scheme similar to that shown in FIG. 4 is combined with other dynamic thermal management techniques. Thus, this embodiment may include the operations of reading a temperature sensor (block 300), determining if a threshold is exceeded (block 302), and cooling (block 304) the integrated circuit (or portion thereof) if the threshold is exceeded, using a thermoelectric cooler driven with a fixed or dynamically controlled current as appropriate, in a manner similar to that described above in connection with FIG. 4.

In accordance with another aspect, a temperature sensor may be read again (block 350), and the sensed temperature compared (block 352) to a second threshold which may be the same or a different threshold than that of the first threshold of the comparison operation of block 302. For example, if the second threshold is higher than the first threshold, and the temperature is found to have exceeded the higher, second threshold, it may be appropriate to employ (block 354) as a backup, another dynamic thermal management technique to cool the integrated circuit. Thus, if employing the thermoelectric cooler or coolers alone is not sufficient to maintain the temperature of the integrated circuit or circuit portion within a safety margin, additional dynamic thermal management techniques may be employed in addition to or instead of operation of the thermal electric coolers.

One example of such an additional dynamic thermal management technique is a softcooling technique which suspends operation of the overheated circuit portion such as a core and resumes execution in that core or other circuit portion once the temperature is within the safety margin again. Other dynamic thermal management techniques which may be employed in addition to, prior to or after the thermal electric coolers include the softcooling techniques dynamic voltage/frequency scaling (DVFS) and thread migration (TM). Dynamic voltage/frequency scaling can reduce the clock speeds or the voltage levels supplied to the integrated circuit to slow down operation and thereby reduce heat generation if it is overheating. Thread migration can shift a thread of operation from an integrated circuit portion such as a core which is overheating to another cooler core of a multicore integrated circuit.

It is believed that, in some applications, combining cooling by operating thermoelectric coolers, with cooling by other dynamic thermal management techniques, can reduce the impact of the use of such other dynamic thermal management techniques on the overall speed of operation of the integrated circuit. In other applications, it is believed that, combining cooling by operating thermoelectric coolers, with cooling by thread migration, can reduce the need for more invasive dynamic thermal management techniques such as stopping operation or reducing the speed of operation.

The operational current provided to a particular TEC may be at a fixed value independent of the operation of other dynamic thermal management techniques. It is believed that good results may be achieved using such a fixed TEC current in combination with thread management. Alternatively, the TEC current may be computed dynamically, coordinating the TEC operating current level with the operations of other dynamic thermal management techniques. It is believed that a dynamic thermal management technique which utilizes a variable input current to the TECs may improve efficiency of operation, depending upon the particular application.

Also, the number of TECs may be reduced by providing some but not all cores of a multicore integrated circuit with an associated TEC. Should overheating develop, threads may be shifted to those cores having a TEC disposed over that core. It is appreciated that a variety of thermal management techniques may be used in combination with microarchitecture controlled Peltier effect cooling in accordance with the present description.

The controller 108 may be implemented with dedicated circuitry of the integrated circuit of the die. Also, the controller 108 may be implemented utilizing one or more of hardware, software or firmware. Thus, in one example, the controller 108 for controlling one or more TECs either alone or in combination with other dynamic thermal management techniques, may be implemented using the resources of one or more cores of a multi-core integrated circuit. Such a core may be dedicated to temperature control or may perform other processing techniques in addition to temperature control.

The illustrated logic of FIGS. 4 and 5 shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

In certain embodiments, a device or devices in accordance with the present description may be embodied in a computer system including a video controller to render information to display on a monitor coupled to the computer. The computer system may comprise a desktop, workstation, server, mainframe, laptop, handheld computer, cellular telephone, etc. Alternatively, a device or devices in accordance with the present description may be embodied in a computing device that does not include a video controller, such as a switch, router, etc.

Figure 6:
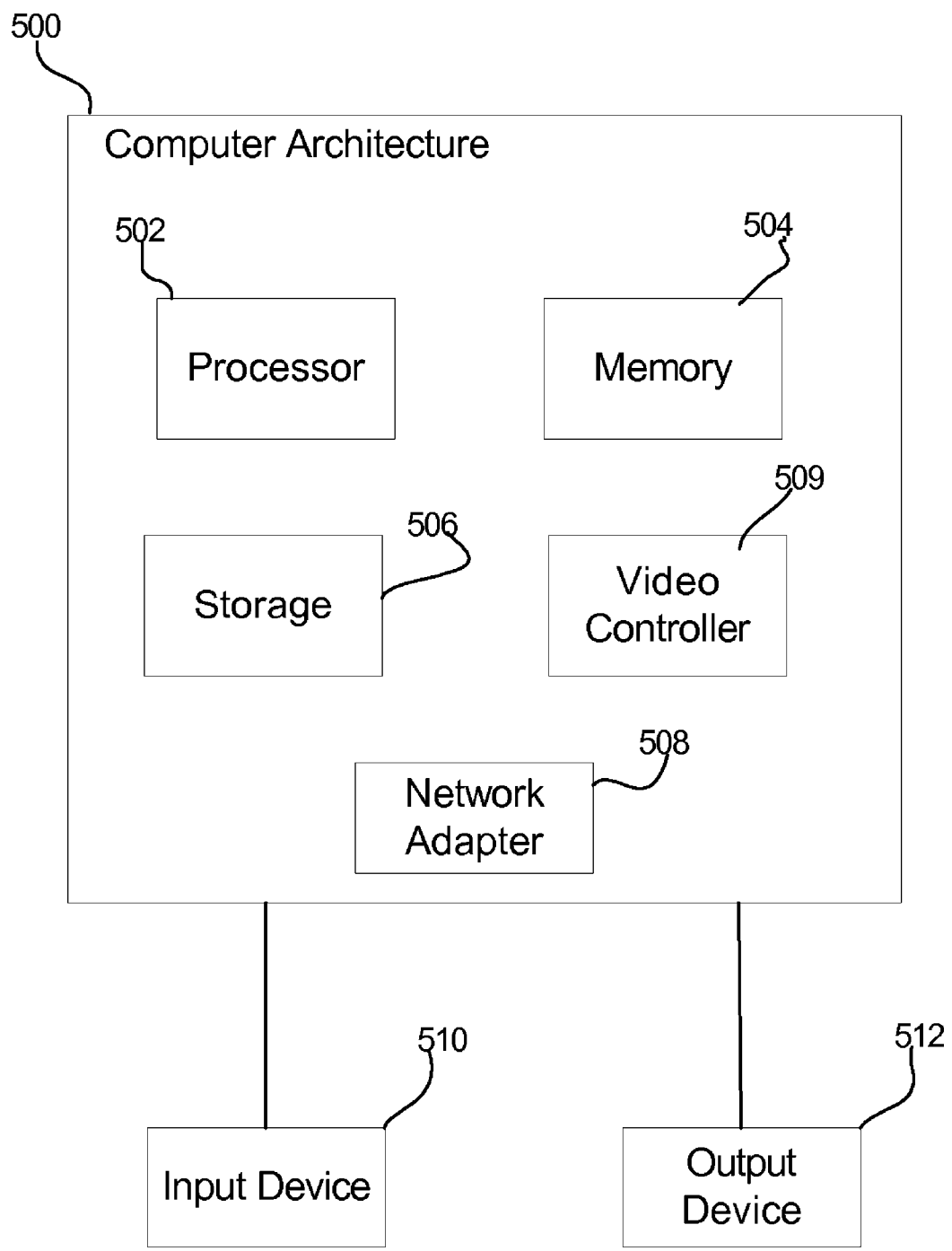
FIG. 6 is a schematic diagram of a computer system employing one or more devices in accordance with the present description.

FIG. 6 illustrates one embodiment of a device such as a computer architecture 500 which may employ integrated circuits having microarchitecture controlled Peltier effect cooling in accordance with the present description, such as the device shown in FIG. 1. The architecture 500 may include a processor 502 (e.g., a microprocessor), a memory 504 (e.g., a volatile memory device), and storage 506 (e.g., a non-volatile storage, such as magnetic disk drives, optical disk drives, a tape drive, etc.). The storage 506 may comprise an internal storage device or an attached or network accessible storage. Programs in the storage 506 are loaded into the memory 504 and executed by the processor 502 in a manner known in the art. The architecture further includes a network controller 508 to enable communication with a network, such as an Ethernet, a Fibre Channel Arbitrated Loop, etc. Further, the architecture may, in certain embodiments, include a video controller 509 to render information on a display monitor, where the video controller 509 may be embodied on a video card or integrated on integrated circuit components mounted on the motherboard, for example. An input device 510 is used to provide user input to the processor 502, and may include a keyboard, mouse, pen-stylus, microphone, touch sensitive display screen, or any other activation or input mechanism known in the art. An output device 512 is capable of rendering information transmitted from the processor 502, or other component, such as a display monitor, printer, storage, etc.

The foregoing description of various embodiments has been presented for the purposes of illustration and description. It is not intended to be exhaustive or to limit to the precise form disclosed. Many modifications and variations are possible in light of the above teaching.

What is claimed is:

1. A device, comprising:
a die having an integrated circuit;
a plurality of temperature sensors, each sensor being thermally coupled to an associated portion of the integrated circuit of the die and adapted to provide an output as a function of the temperature of the associated integrated circuit portion;
a plurality of thermoelectric coolers disposed over the die, each thermoelectric cooler being thermally coupled to an associated integrated circuit portion associated with a sensor;
wherein said integrated circuit includes a controller adapted to control as a function of sensor output associated with an integrated circuit portion, operation of at least one of the plurality of thermoelectric coolers, wherein each cooler cools at least the associated portion of said integrated circuit when operated;
wherein said controller is adapted to compare output of a first sensor associated with a first portion of said integrated circuit, to a predetermined threshold and activate a first thermoelectric cooler associated with the first portion of said integrated circuit if the predetermined threshold is exceeded and also activate at least one second and adjacent thermoelectric cooler associated with a second and adjacent integrated circuit portion notwithstanding that the output of a second sensor associated with the second and adjacent integrated circuit portion does not exceed the predetermined threshold, and maintain as inactive, a third thermoelectric cooler associated with a third portion of said integrated circuit if the sensor output of the third sensor does not exceed the predetermined threshold.

2. The device of claim 1 wherein each said temperature sensor is integrated on said die and wherein said device further comprises:
an integrated heat sink thermally coupled to said die and said thermoelectric cooler is disposed between die and said heat sink;
a thermal interface material disposed between said integrated heat sink and said die wherein said thermoelectric cooler is disposed within said thermal interface material; and
a package wherein said die, thermal interface material and thermoelectric cooler are packaged within said package.

3. The device of claim 1 wherein said controller is adapted to deactivate the first thermoelectric cooler associated with the first portion of the integrated circuit if the output of the first sensor falls below the predetermined threshold.

4. The device of claim 1 wherein said device is a computer system comprising:
a central processing unit which includes said die and thermoelectric cooler;
a memory electronically coupled to said central processing unit;
an input device electronically coupled to said central processing unit;
an output device electronically coupled to said central processing unit; and
a video controller electronically coupled to said central processing unit.

5. The device of claim 1 wherein each integrated circuit portion is a core of a multicore central processing unit.

6. The device of claim 5 wherein said controller is adapted to shift a thread of operation from one core to another core as a function of the outputs of said sensors.

7. A method, comprising:
reading a plurality of temperature sensors, each sensor being thermally coupled to an associated portion of an integrated circuit of a die and adapted to provide an output as a function of the temperature of the associated integrated circuit portion; and
controlling as a function of sensor output, operation of at least one of a plurality of thermoelectric coolers disposed over the die, each thermoelectric cooler being thermally coupled to an associated integrated circuit portion associated with a sensor wherein each cooler cools at least the associated portion of said integrated circuit when operated and wherein said controlling includes comparing output of a first sensor associated with a first portion of said integrated circuit, to a predetermined threshold and activating a first thermoelectric cooler associated with the first portion of said integrated circuit if the predetermined threshold is exceeded by the first sensor output, and also activating at least a second, adjacent thermoelectric cooler associated with a second and adjacent integrated circuit portion notwithstanding that the output of a second sensor associated with the second and adjacent integrated circuit portion does not exceed the predetermined threshold, and maintaining as inactive, a third thermoelectric cooler associated with a third portion of said integrated circuit if the sensor output of the third sensor does not exceed the predetermined threshold.

8. The method of claim 7 wherein said controlling includes determining operating conditions of the integrated circuit and activating the thermoelectric coolers when predetermined operating conditions are met.

9. The method of claim 7 further comprising controlling as a function of said sensor output, operation of said integrated circuit to cool said integrated circuit portion.

10. The method of claim 9 wherein said integrated circuit operation controlling includes shifting a thread of operation from said integrated circuit portion to a different portion of said integrated circuit if the sensor output exceeds a predetermined threshold.

11. The method of claim 9 wherein said integrated circuit operation controlling includes suspending operation of said integrated circuit portion if the sensor output exceeds a predetermined threshold.

12. The method of claim 9 wherein said integrated circuit operation controlling includes reducing at least one of a frequency of operation and a voltage of operation of said integrated circuit portion if the sensor output exceeds a predetermined threshold.

13. The method of claim 9 wherein said integrated circuit operation controlling includes shifting a thread of operation from a fourth integrated circuit portion which lacks an associated thermoelectric cooler to a fifth integrated circuit portion, the fifth integrated circuit portion having an associated thermoelectric cooler, the shifting of a thread of operation occurring if a sensor output of a sensor associated with the fourth integrated circuit portion exceeds a predetermined threshold.

14. The device of claim 5 wherein a first core of the multicore central processing unit has an associated temperature sensor but lacks an associated thermoelectric cooler, and a second core of the multicore central processing unit has an associated thermoelectric cooler and wherein said controller is adapted to shift a thread of operation from said first core to said second core if a sensor output of the sensor associated with the first core exceeds a predetermined threshold.

15. The device of claim 1 wherein said integrated circuit controller is further adapted to control as a function of said sensor output, operation of said integrated circuit to cool said integrated circuit portion.

16. The device of claim 15 wherein the controlling the operation of the integrated circuit includes reducing at least one of a frequency of operation and a voltage of operation of said integrated circuit portion if the sensor output exceeds a predetermined threshold.

17. The device of claim 15 wherein the controlling the operation of the integrated circuit includes suspending operation of said integrated circuit portion if the associated sensor output exceeds a predetermined threshold.

18. The method of claim 7 wherein each integrated circuit portion is a core of a multicore central processing unit, the method further comprising shifting a thread of operation from one core to another core as a function of the outputs of the associated sensors.

19. A method, comprising:
    reading a plurality of temperature sensors, each sensor being thermally coupled to an associated portion of an associated core of a multicore central processing unit of an integrated circuit of a die and adapted to provide an output as a function of the temperature of the associated core portion;
    controlling as a function of sensor output, operation of at least one of a plurality of thermoelectric coolers disposed over the die, each thermoelectric cooler being thermally coupled to an associated core portion associated with a sensor wherein each cooler cools at least the associated core portion of said integrated circuit when operated and wherein said controlling includes comparing each output of a first sensor associated with a first core portion of said integrated circuit, to a predetermined threshold and activating a first thermoelectric cooler associated with the first core portion of said integrated circuit if the predetermined threshold is exceeded by the first sensor output, and also activating at least a second, adjacent thermoelectric cooler associated with a second and adjacent core portion notwithstanding that the output of a second sensor associated with the second and adjacent core portion does not exceed the predetermined threshold, and maintaining as inactive, a third thermoelectric cooler associated with a third core portion of the integrated circuit if the sensor output of the third sensor does not exceed the predetermined threshold; and
    controlling as a function of at least one sensor output, operation of said integrated circuit to cool a core portion being cooled by a thermoelectric cooler including shifting a thread of operation from a core portion to a different core portion if a sensor output exceeds a predetermined threshold and reducing at least one of a frequency of operation and a voltage of operation of a core portion if a sensor output exceeds a predetermined threshold.

20. The method of claim 19 wherein the integrated circuit operation controlling includes shifting a thread of operation from a first core portion which lacks an associated thermoelectric cooler to a second, different core portion which has an associated thermoelectric cooler if a sensor output of a sensor associated with the first core portion exceeds a predetermined threshold.

* * * * *